United States Patent
Maruyama et al.

[11] Patent Number: 5,931,282
[45] Date of Patent: Aug. 3, 1999

[54] COMPONENT COLLECTIVE AND COMPONENT COLLECTIVE FEEDING APPARATUS

[75] Inventors: Yoshio Maruyama, Kyoto; Shinji Kadoriku, Takarazuka; Toshiaki Yamauchi, Yawata; Naomi Kuromoto; Hiroshi Yamauchi, both of Hirakata, all of Japan

[73] Assignee: Matsushita Electric Industrial Co., Ltd., Kadoma, Japan

[21] Appl. No.: 08/832,156

[22] Filed: Apr. 2, 1997

Related U.S. Application Data

[62] Division of application No. 08/504,654, Jul. 20, 1995, Pat. No. 5,769,236.

[30] Foreign Application Priority Data

Jul. 20, 1994 [JP] Japan .................................. 6-167799

[51] Int. Cl.$^6$ ........................ B65G 17/36; B65G 17/46; B65H 5/28
[52] U.S. Cl. ...................... 198/704; 198/867.11; 221/74; 221/78; 221/90; 221/86
[58] Field of Search ...................... 198/867.11, 867.12, 198/476.1, 477.1, 704; 221/74, 78, 90

[56] References Cited

U.S. PATENT DOCUMENTS

| | | | |
|---|---|---|---|
| 3,750,860 | 8/1973 | Jaffre | 198/477.1 |
| 4,989,722 | 2/1991 | Kuepper | 198/476.1 |
| 5,388,945 | 2/1995 | Garric et al. | 414/217 |
| 5,531,859 | 7/1996 | Lee et al. | 156/584 |
| 5,558,201 | 9/1996 | Oppliger et al. | 198/476.1 |

FOREIGN PATENT DOCUMENTS

| 1025-605 | 6/1983 | U.S.S.R. | 198/476.1 |
|---|---|---|---|

*Primary Examiner*—David A. Pucci
*Assistant Examiner*—Steven B. McAllister
*Attorney, Agent, or Firm*—Weneroth, Lind & Ponack, L.L.P.

[57] ABSTRACT

A component carrier assembly includes component holders each for holding a component therein and connected to one another in a form of a tape carrier. Each holder is provided with a cavity to accommodate the component, a closure for shutting an opening of the cavity, and a device for securing the lid structure in a closed position. An apparatus for feeding the component carrier includes a device for transferring the component carrier, a device for forcibly opening a closure of a component holder transferred to a predetermined position, and a device for forcibly closing the closure of the component holder after a component is removed from the cavity.

6 Claims, 13 Drawing Sheets

COMPONENT COLLECTIVE AND COMPONENT COLLECTIVE FEEDING APPARATUS

This is a divisional application of Ser. No. 08/504,654, filed Jul. 20, 1995, now U.S. Pat. No. 5,769,236.

BACKGROUND OF THE INVENTION

The present invention relates to a component collective of many electronic components or mechanical components accommodated in a tape-like carrier and a feeding apparatus for feeding the component collective.

In a widely known component collective of the prior art, components are accommodated in storage cells of a carrier tape and a cover tape is bonded to the carrier tape. The components are thus sealed and held within the carrier tape.

The cover tape is detached from the carrier tape when the inside components are to be used. Since the separated cover tape is not recyclable, the prior art is contrary to the current trend of saving resources and rather causes an increase of costs. What's worse, the prior art needs a winding reel for winding the separated cover tape, thus making a feeding apparatus more complicated in structure.

SUMMARY OF THE INVENTION

The object of the present invention is therefore to provide a component collective or carrier in which, similar to a conventional component collective covered with a cover tape, components are sealed to be protected against flaws and dust.

A further object of the present invention is to provide an apparatus which is suitable for feeding the above component collective.

In accomplishing these and other objects, according to one aspect of the present invention, there is provided a component collective comprising component holders each holding a component therein and connected one another in the form of a tape carrier. The component holder is provided with a cavity to accommodate the component, a closure for shutting an opening of the cavity, and a device for keeping the closure at a closed position.

According to another aspect of the present invention, there is provided a feeding apparatus for feeding a component collective which comprises component holders each holding a component therein and connected to one another in a form of a tape carrier. The component holder is provided with a cavity to accommodate the component, a closure or lid means for shutting an opening of the cavity, and a means for keeping the lid means at a closed position.

The feeding apparatus includes a means for transferring the component collective, a means for forcibly opening a lid means of a component holder transferred to a predetermined position, and a means for forcibly closing the lid means of the component holder after a component is removed.

The component collective of the present invention is produced by accommodating components in cavities of component holders while a lid means of each component holder is opened, and then closing the lid means. Loading of the components at this time is easily automated.

Since the component collective loading components therein is in the form of a tape, the component collective is stored and/or transported compactly, for example, in a state where it is wound around a reel. The lid means, kept at the closed position by the keeping means, securely holds the components inside the cavities, thereby preventing the components from being flawed or damaged by dust.

In supplying components to an electronic component mounting apparatus, the component collective of components can be provided in a compact state, e.g., wound around a reel, to the component collective feeding apparatus installed in the mounting apparatus. The opening means for opening the lid means at the take-out position is simpler and more compact in structure than a cover tape detaching means in the conventional apparatus. The components in the cavities can be taken out at the take-out position while the lid means is opened, and supplied to a working tool of the mounting apparatus, etc. The lid means is designed to be forcibly closed after the component is removed. The emptied tape can be taken back to the reel and prepared in the compact state for the next use. Since it is not necessary to separate the cover tape in the component collective of the present invention, as opposed to the prior art, the component collective is never damaged and is reusable.

The component collective feeding apparatus of the present invention is provided with means for transferring the component collective, means for forcibly opening the lid means, and means for forcibly closing the lid means. The apparatus smoothly feeds the component collective having the above-described features to a predetermined position.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
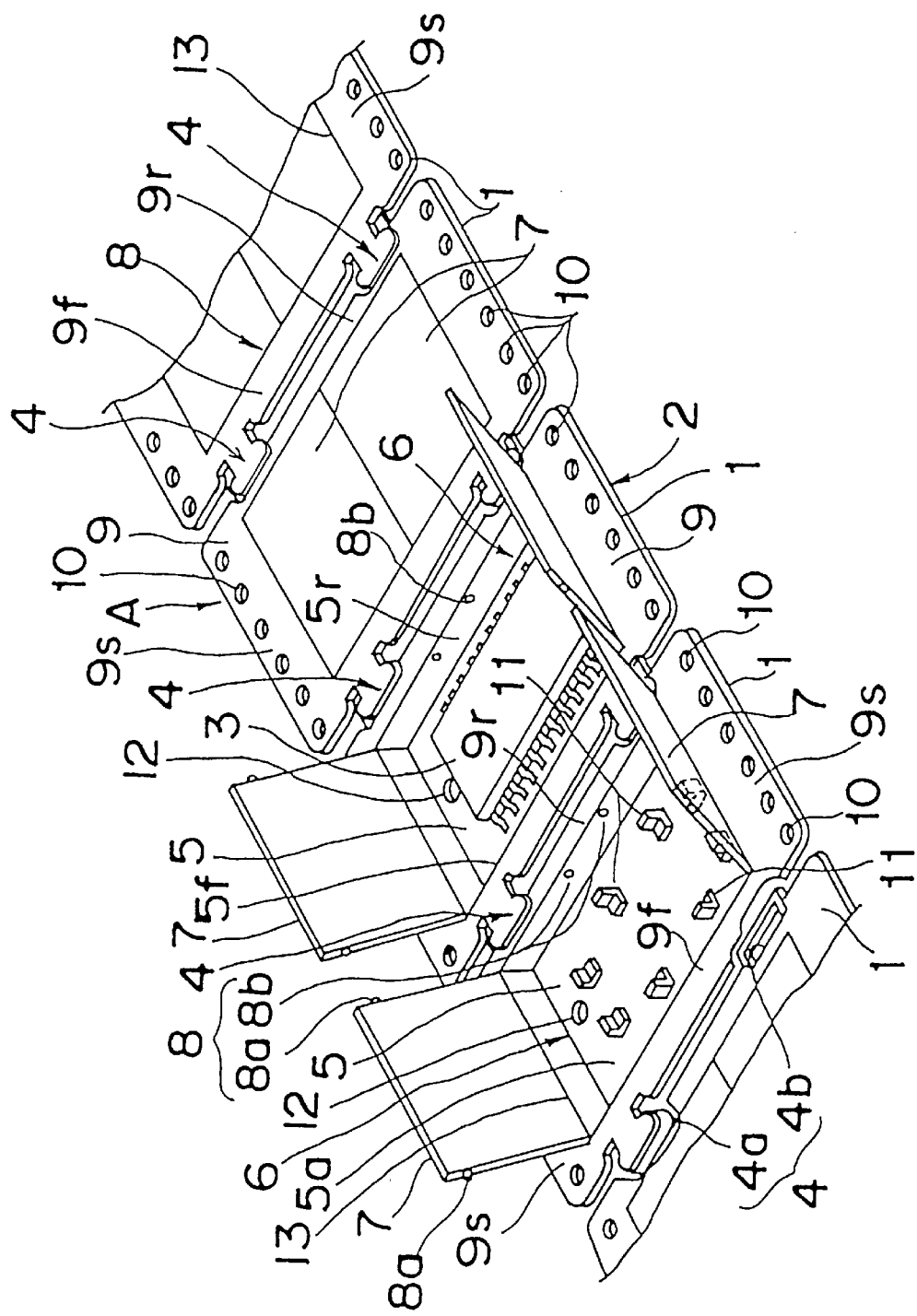
FIG. 1 is a perspective view of a component collective in a first embodiment of the present invention.

Before the description of the present invention proceeds, it is to be noted that like parts are designated by like reference numerals throughout the accompanying drawings.

A first embodiment of the present invention will be described with reference to FIGS. 1–7, 17A, 17B, and 20.

Figure 2:
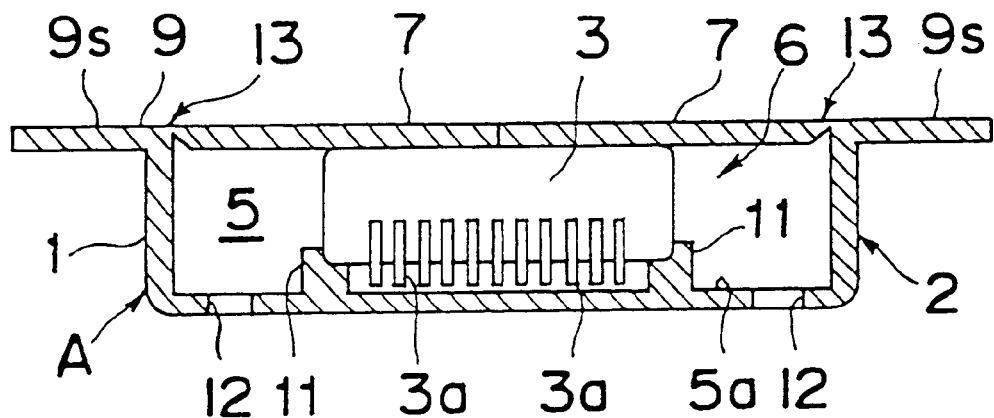
FIG. 2 is a lateral sectional view of the component collective of FIG. 1.
Figure 3:
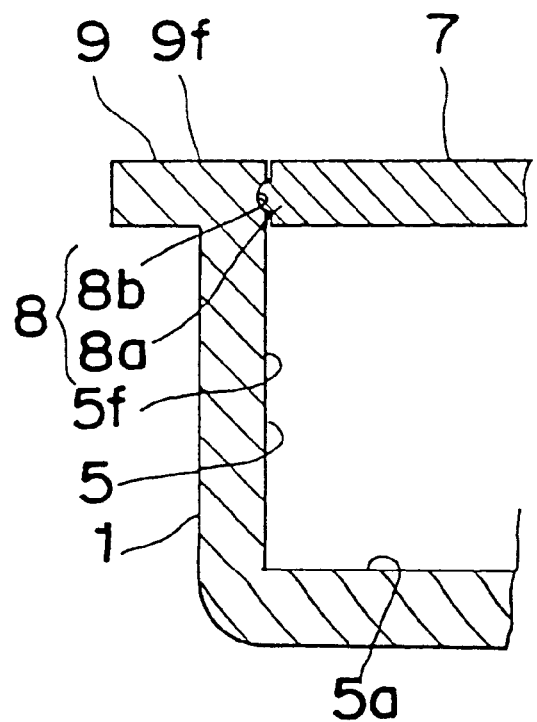
FIG. 3 is a longitudinal sectional view of a part of the component collective.

As shown in FIGS. 1–3, a component collective A of the embodiment constitutes a tape carrier 2 formed by connecting many component holders 1 to each other. Each component holder 1 is integrally molded of a resin material and accommodates a component 3. The component holders 1 are connected to each other at the projecting/recessed coupling parts 4.

The component holder 1 has a component holding cavity 5 for holding the component 3 therein, a pair of lids 7 each pivotally secured to an opening 6 of the cavity 5, and a closed position keeping means 8 for keeping each of the lids 7 in the closed position.

Figure 17A:
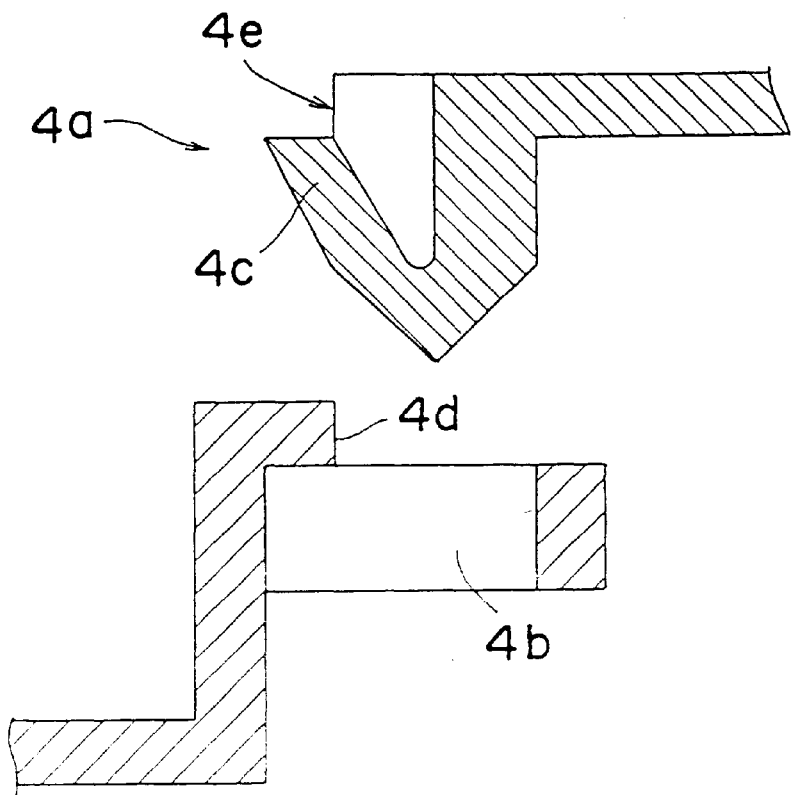
FIG. 17A is an enlarged sectional side view of a coupling projection and a coupling hole of the component collective in a state where the projection is not fitted into the hole.
Figure 17B:
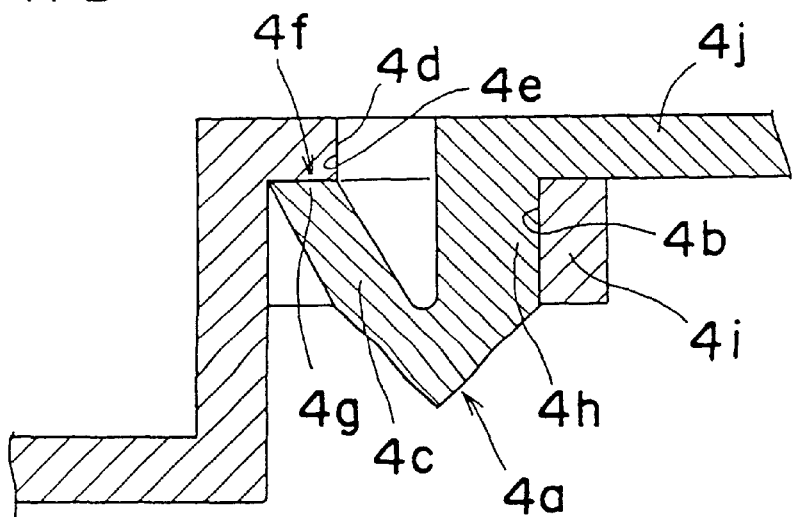
FIG. 17B is an enlarged sectional side view of the coupling projection and the coupling hole of the component collective in a state where the projection is fitted into the hole.

At a flange 9, more specifically, at the right and left extensions 9s of the flange 9 extending from the periphery of an upper edge of the cavity 5 of each component holder 1, a series of feed holes 10 are formed. The feed holes 10 are formed with an equal pitch over the whole tape carrier 2. At a front extension 9f and a rear extension 9r of the flange 9 are formed coupling projections 4a and coupling holes 4b for fitting the coupling projections 4a therein, respectively. The coupling projections 4a and the coupling holes 4b constitute the coupling part 4. The component holders 1 are connected to one another by forcibly fitting the coupling projections 4a of the rear component holder 1 into the coupling holes 4b of the front component holder 1. That is, as shown in FIGS. 17A and 17B, the projection 4a is formed in a V-shape and when the projection 4a is inserted and fitted into the hole 4b with some pressure, a claw portion 4c of the projection 4a is, initially, elastically deformed due to contact with a surface 4d of hole 4b. After the claw portion 4c of the projection 4a is fitted into the hole 4b, the claw portion 4c is returned to its original V-shape due to its elastic force as shown in FIG. 17B. After the projection 4a is fitted into the hole 4b, even when any tensile force is applied to the tape carrier 2, a base portion 4h of the claw portion 4c contacts an inner wall 4i of the hole 4b so that the coupling of the projection 4a and the hole 4b withstands the tensile force. Even when a compressive force is applied to the tape carrier 2, a contact surface 4e of the projection 4a contacts another inner surface 4d of the hole 4b so that the coupling of the projection 4a and the hole 4b withstands the compressive force. When the tape carrier 2 is wound around a reel or when the tape carrier 2 contacts guide rollers, a bending force is applied to the tape carrier 2. In this case, an upper surface 4g of an end of the claw portion 4c contacts a lower surface 4f of the periphery of the hole 4b so that the surface 4f prevents the claw portion 4c from moving upward in FIG. 17B to withstand the bending force. The base portion 4j of the projection 4a can be bent. Especially, when the projection 4a and the hole 4b are made of polypropylene resin, such a resin has a self-hinge function and thus the base portions 4j can be bent ten thousand through one million times.

A plurality of supporting projections 11 are provided at a bottom 5a of the component holding cavity 5 to support and protect the component 3 so that leads 3a of the component 3 are not directly touching the bottom 5a of the cavity 5, as is clear from FIG. 2. A rod insertion hole 12 is formed in the vicinity of each of the right and left end parts of the bottom 5a.

The opening 6 of the holding cavity 5 is covered with the right and left lids 7 in a manner so that the lids can be freely opened/closed. The pair of lids 7 are symmetric with respect to the center line in the longitudinal direction of the component collective A. A groove is notched at a part of the lid 7 which is connected to the extension 9s, thereby constituting a hinge portion 13 formed of a thin resin.

As shown in FIG. 2, when the right and left lids 7 are closed, the upper surface of the lids 7 are even with the upper surface of the flange 9 and the component 3 is held with some pressure between the lids 7 and the supporting projections 11. The closed position keeping means 8 holds the lids 7 in the closed state. That is, an engaging projection 8a at each lateral side face of the lid 7 is engaged with a corresponding engaging recess 8b at each of front and rear wall surfaces 5f, 5r of the holding cavity 5, thereby holding the lid 7 in the closed state. Although the lid keeping means 8 is made sufficiently resistive to the repulsive force from the component 3, held and pressed between the lids 7 and the supporting projections 11, it is constructed so as to allow the lids 7 to open when not smaller than a certain amount of external force is applied to the lids 7.

Figure 7:
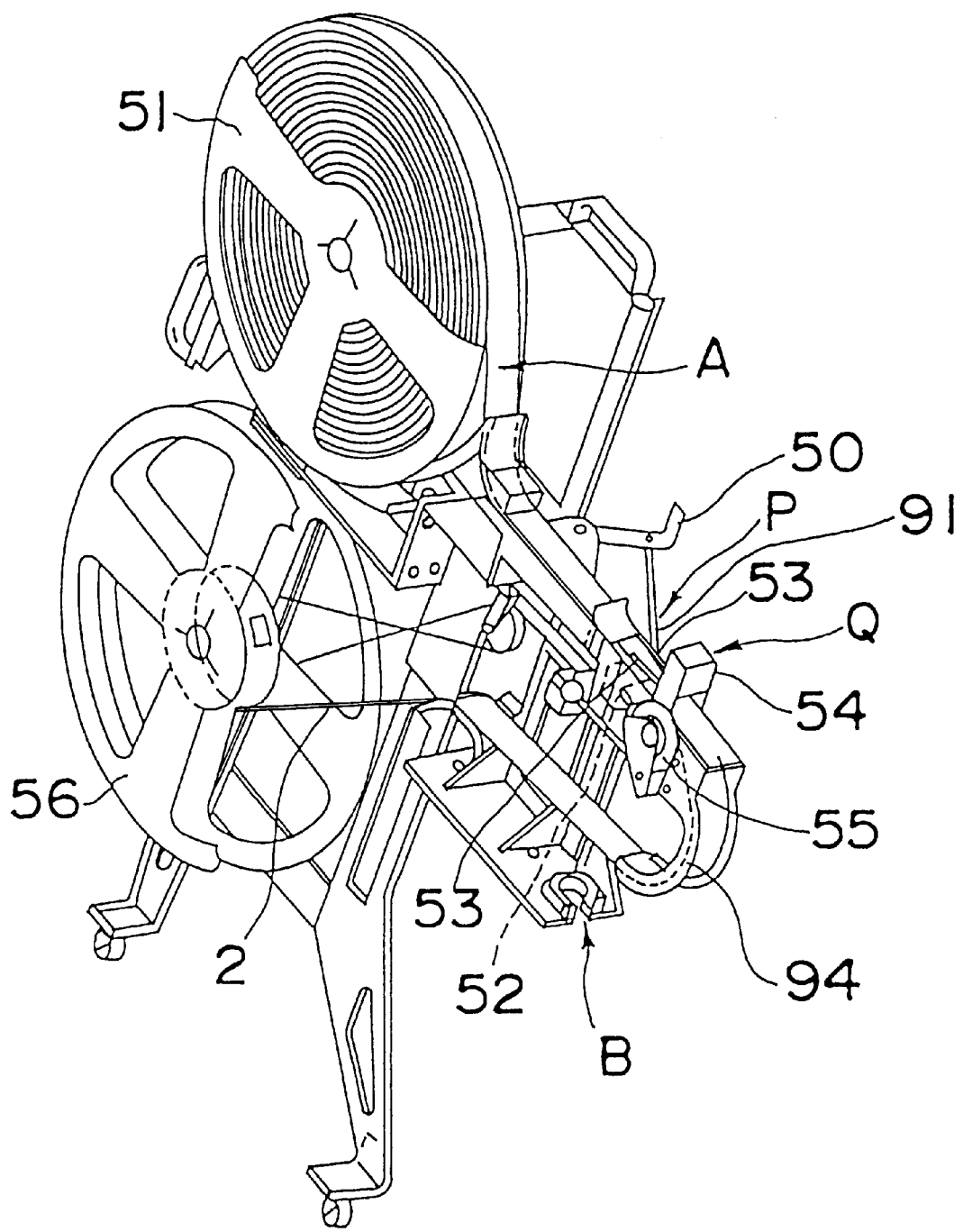
FIG. 7 is a perspective view of a component collective feeding apparatus according to an embodiment of the present invention.

The thus-constituted component collective or carrier A is wound around a reel 51 and set in a component collective feeding apparatus B to feed the components 3 to an electronic component mounting apparatus or the like, as indicated in FIG. 7.

Figure 4:
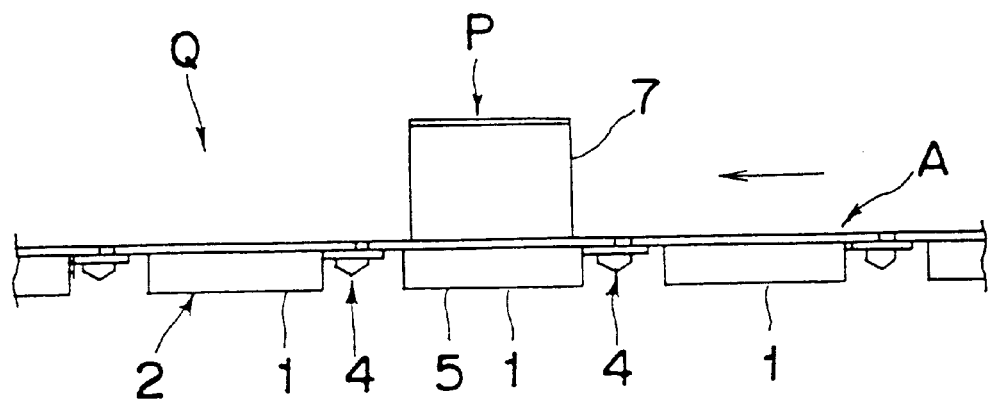
FIG. 4 is a schematic side view of the component collective.
Figure 20:
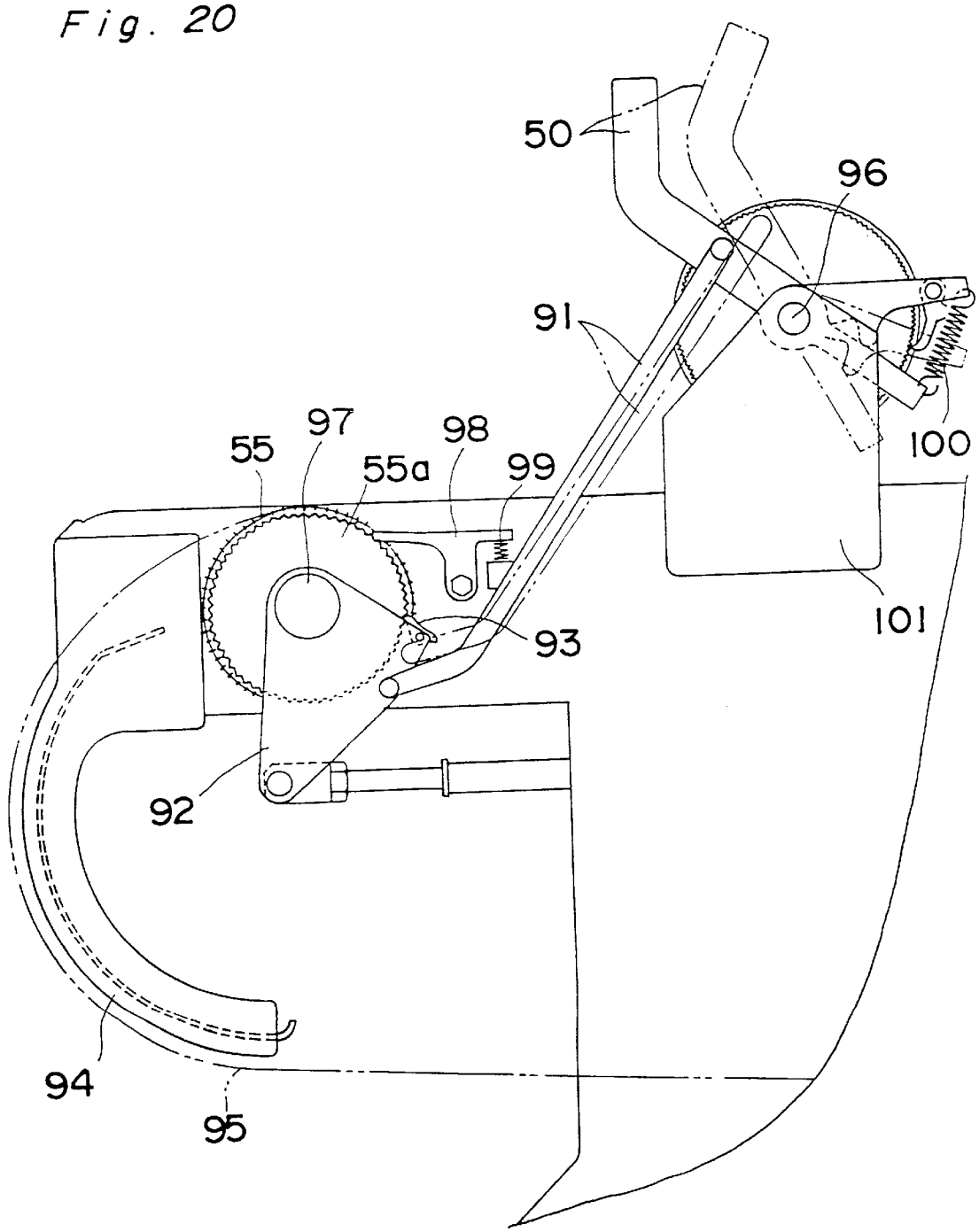
FIG. 20 is a side view of a mechanism for feeding the component collective in the first embodiment.

The component collective feeding apparatus B takes out and guides the component collective A from the reel 51 to a component take-out position P by the action of a lever 50 (referring to FIGS. 4 and 20). The feed holes 10 are utilized to move the component collective A at this time. That is, the feed holes 10 are engaged with a sprocket wheel 55. The lever 50 is capable of swinging around a shaft 96 and is connected to an upper end of a link 91. The lower end of the link 91 is connected to a triangle plate 92 swinging around a shaft 97. The plate 92 has ratchet gear 93 for engaging a sprocket gear 55a of the sprocket wheel 55 to rotate pitch by pitch in one direction. Then, the lever 50 is swung, the sprocket gear 55a together with the sprocket wheel 55 is rotated via the link 91, the plate 92, and the ratchet gear 93, so that the component collective A is fed. That is, the tape carrier 2 is transferred along a curve of the sprocket wheel 55 and a curved guide member 94 in a direction 95 shown by a chain-dotted line. In FIG. 20, reference numeral 98 denotes a stopper for preventing the sprocket gear 55a from rotating in the opposite direction, 99 denotes a spring for urging the stopper 98 to a position for engaging the stopper 98 with the sprocket gear 55a, 100 denotes a spring for urging the lever 50 to its original position after the lever 50 is swung, 101 denotes a frame supporting the lever 50, sprocket wheel 55, etc. Since the operation of moving the component collective A is the same as that of the known tape carrier and is well known, the detailed explanation thereof will be abbreviated here.

Figure 5:
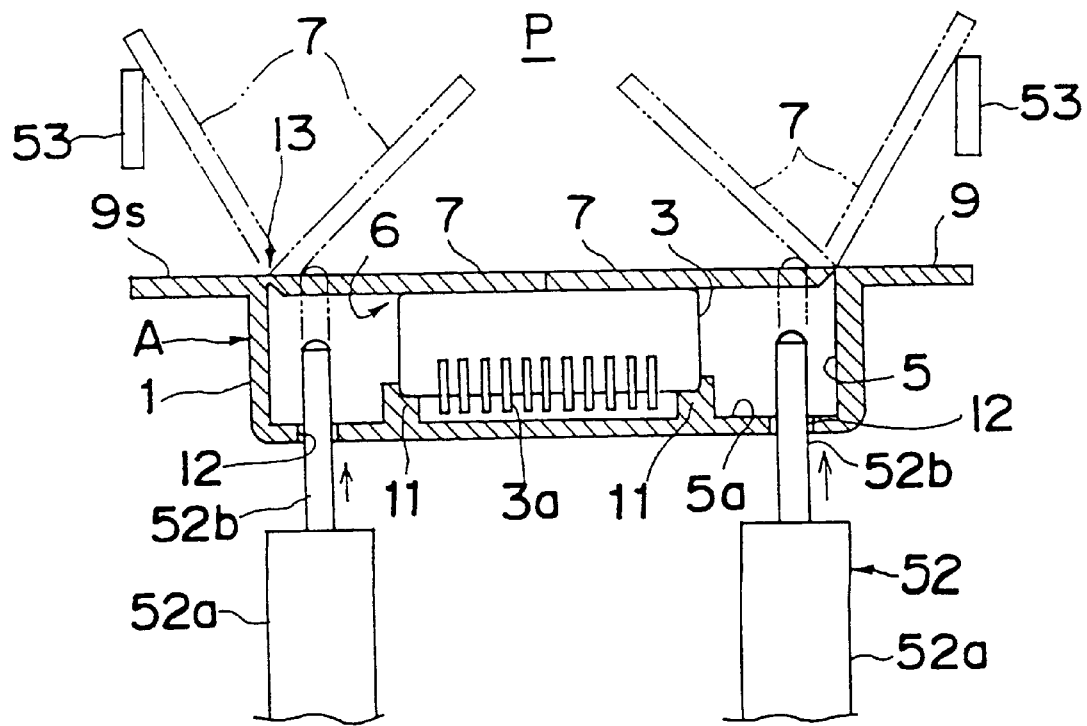
FIG. 5 is lateral sectional view showing the operation when a lid means is opened.

Referring to FIG. 5, a lid opening mean 52, with right and left air cylinders 52a, is disposed below the component collective A at the take-out position P. A pair of right and left guides 53 of the apparatus B receive the opened lids 7 inclined at a predetermined angle outward. As is generally known, a component take-out device (not shown), for example, a suction nozzle head is placed at the take-out position P to take out the component 3 from the holder 1.

The air cylinders 52a have push rods 52b which, pass through the rod insertion holes 12 of the holder 1, push upward and open the lids 7. The air cylinders 52a start to operate while the component holder 1 stops at the position P. After the lids 7 are opened by the air cylinders 52a, as indicated by phantom lines in FIG. 5, the push rods 52b are returned to a position below the component holder 1.

During this time, the component take-out device takes out the component 3 from the holding cavity 5.

Figure 6:
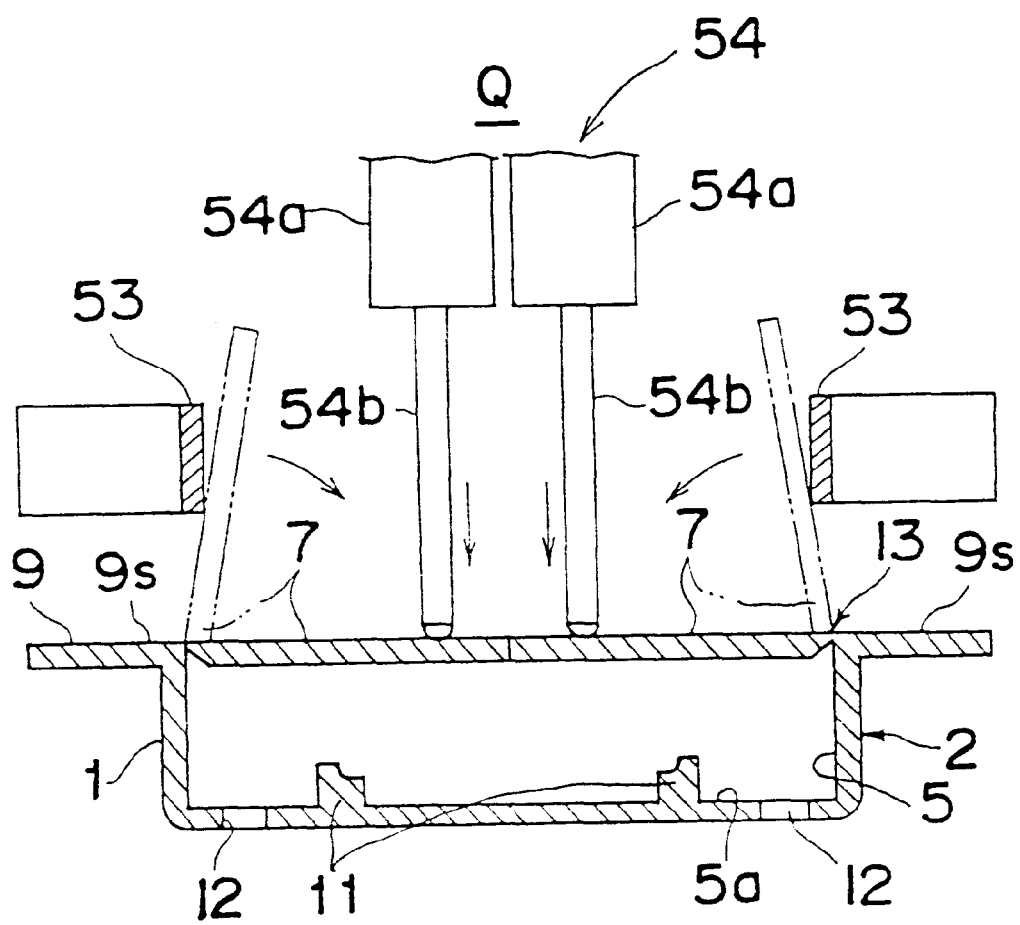
FIG. 6 is a lateral sectional view showing the operation when the lid means is closed.

The emptied component collective A, i.e., emptied tape carrier 2 is sent to a closing position O. Immediately before the tape carrier 2 reaches the closing position O, the pair of guides 53 extending from the take-out position P to the closing position O turn the lids 7 inward as shown in FIG. 6, so that the lids 7 are closed by their own weight just before reaching the closing position O. The distance of the right and left guides 53 is gradually narrowed as is clear in FIGS. 5–7.

A lid closing means 54 is arranged above the tape carrier 2 at the closing position O as shown in FIG. 6. The lid closing mean 54 has a pair of right and left air cylinders 54a. While the component holder 1 is intermittently fed and stops at the closing O, the air cylinders 54a start operating and push rods 54b of the air cylinders 54a descend to further press the lids 7 which have just closed by their own weight. As a result, the engaging projections 8a are fitted in the engaging recesses 8b (referring to FIG. 3). Handling of the tape carrier 2 is smoothly conducted afterwards as the pair of lids 7 are forcibly closed in the above manner.

The tape carrier 2 is transferred along a curve of the sprocket wheel 55 and wound back around a wind reel 56 for recycling.

Figure 8:
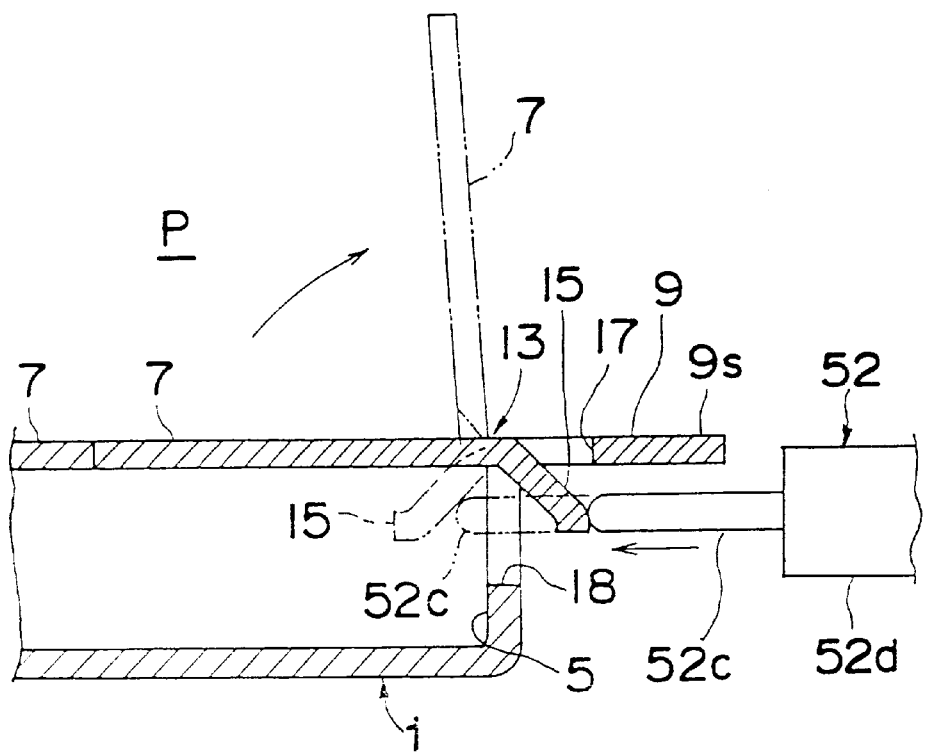
FIG. 8 is a lateral sectional view of a part of a component collective in a second embodiment of the present invention.
Figure 9:
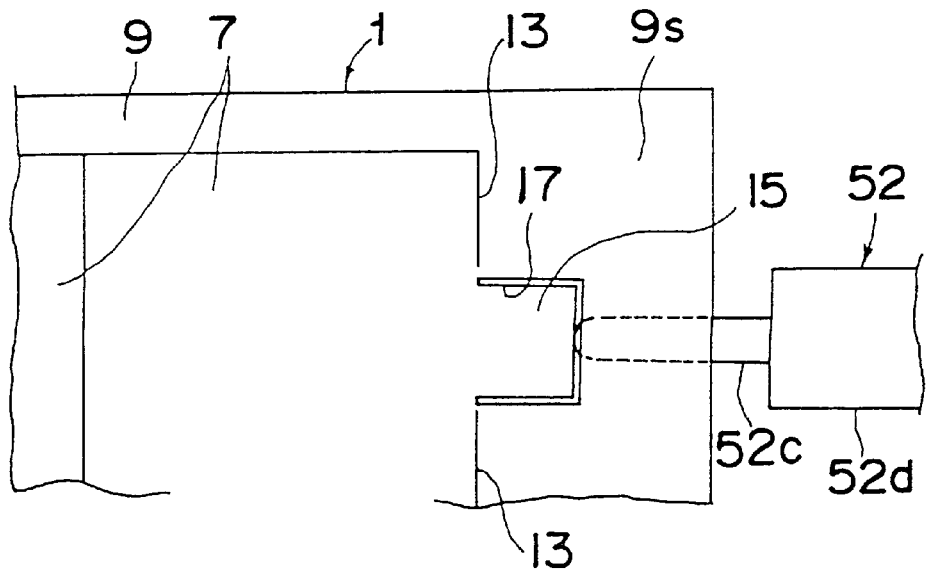
FIG. 9 is a plan view of FIG. 8.

A second embodiment of the present invention will be depicted with reference to FIGS. 8 and 9.

According to the second embodiment, an integral flap 15 is extended from the center of the hinge portion 13 of the lid 7. The lids 7 are opened with the use of the flaps 15. The lid opening means 52 at the take-out position P has an air cylinder 52d at each side of the component holder 1 as shown in FIG. 8. The air cylinder 52d opens the lids 7 when the flap 15 is pressed by push rod 52c. A notch 17 at each extension 9s of the flange 9 and a notch 18 at each of the right and left wall surfaces of the component cavity 5 facilitate smooth operation of the flap 15 and the push rod 52c.

The second embodiment is characterized as above. Since the constitution of other parts is the same as in the first embodiment, the description will be abbreviated.

Figure 10:
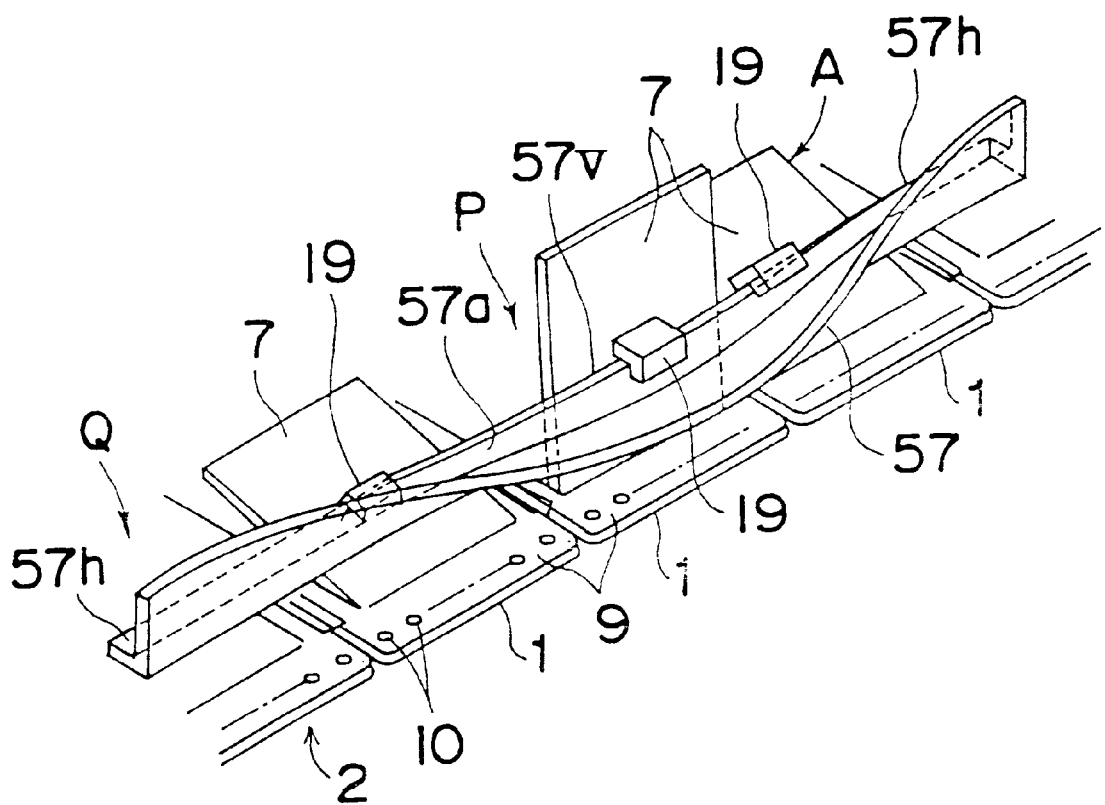
FIG. 10 is a perspective view of a component collective in a third embodiment of the present invention.

Now, a third embodiment of the present invention will be described with reference to FIG. 10.

The third embodiment features a guide projection 19 integrally formed on the upper surface of the lid 7. The projection 19 is utilized to open/close the lid 7 by force. A guide rail 57 extends from a position before to a position after the take-out position P.

The projection 19 is formed in the shape of an inverted L in cross section. The outer side is opened. On the other hand, the guide rail 57 has a guiding main body 57a for engaging with the projection 19. The guide rails twists so that the guiding main body 57a changes gradually from the horizontal posture to the vertical posture and then from the vertical posture to the horizontal posture.

Each projection 19 is engaged with each horizontal part 57h of the guiding main body 57a considerably before the take-out position P. During the time when the component holder 1 is transferred to the take-out position P, the lids 7 are gradually opened. The lids 7 are wide open approximately in the vertical direction so that the component 3 can be removed from the cavity 5 when the component holder 1 reaches the take-out position P. Although the projections 19 are engaged with vertical parts 57v of the guiding main body 57a at this time, the projections 19 gradually close the lids 7 as the component 3 is taken out from the cavity 5 and the component holder 1 is sent to the closing position O. When the component holder 1 reaches the closing position O, the projections 19 are engaged with the horizontal parts 57h of the guiding main body 57a to thereby force the lids 7 to close.

The third embodiment does not require the rod insertion holes 12 provided in the first embodiment, nor the notches 17, 18 of the second embodiment, and therefore the sealing properties inside the cavity 5 are enhanced and the component 3 is effectively protected from dust or the like.

While the third embodiment is characterized in the above-described structure, other parts are constituted in the same manner as in the first and second embodiments, the description of which will be accordingly abbreviated here.

A fourth embodiment of the present invention will be described with reference to FIGS. 11–13. A first feature of the fourth embodiment is a pair of resin springs 8c constituting the keeping means 8. Because of the resin springs 8c, the lids 7 are automatically opened into a fully opened state O simply when the lids 7 move beyond a turning point T and to an opening state side, and are automatically closed in a fully closed state C if the lids 7 are closed to a closed state side passing the turning point T.

Figure 11:
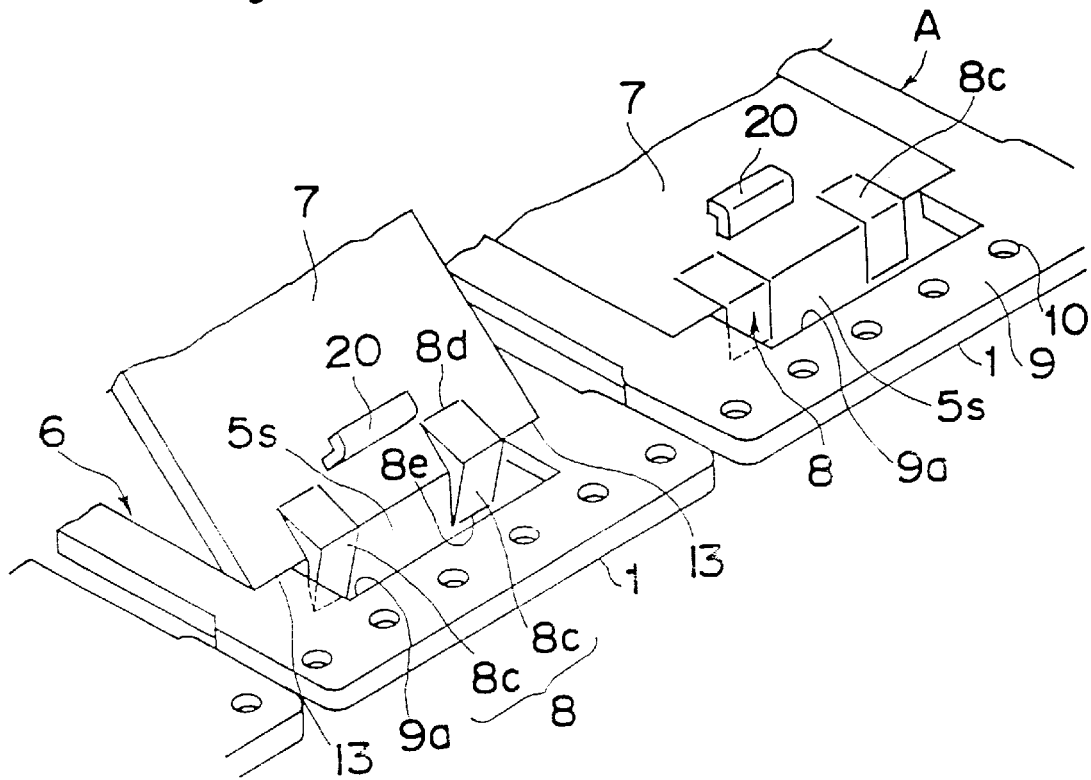
FIG. 11 is a perspective view of a part of a component collective in a fourth embodiment of the present invention.
Figure 12:
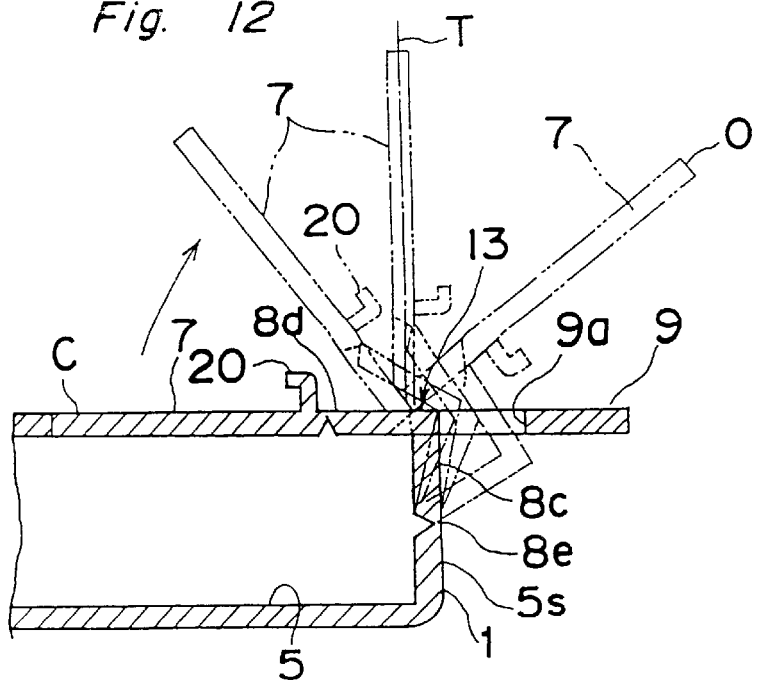
FIG. 12 is a lateral sectional view of FIG. 11.

In FIGS. 11 and 12, according to the fourth embodiment of the present invention, the pair of right and left resin springs 8c are integrally formed with the component holder 1 in such a manner that a front end and a base end of each resin spring 8c are connected to the lid 7 via a this resin hinge portion 8d and to an outside wall 5s of the cavity 5 via a thin resin hinge portion 8e, respectively. An opening 9a formed in the flange 9 prevents any interference between the resin springs 8c and the holder 1. The hinge portion 13 of the lid 7 is located at either side of the pair of resin springs 8c.

The resin springs 8c allow the lids 7 to automatically open in the fully opened state O if the lids 7 move beyond the turning point T from the closed state. Moreover, the spring force of the resin springs 8c not only turns the lids 7 automatically into the perfectly closed state C when the lids 7 pass the turning point T from the opened position, but also maintains the lids 7 positively in the perfectly closed state. The lid opening means 52 for the component collective A of the above characteristics is suitably one that is used in the first and second embodiments. When opening means 52 is used, the stroke of the rods 52b, 52c of the air cylinders 52a, 52d can be shortened and at the same time, the guides 53 provided in the first embodiment suffice as the closing means 54. A special closing means is not required.

Figure 13:
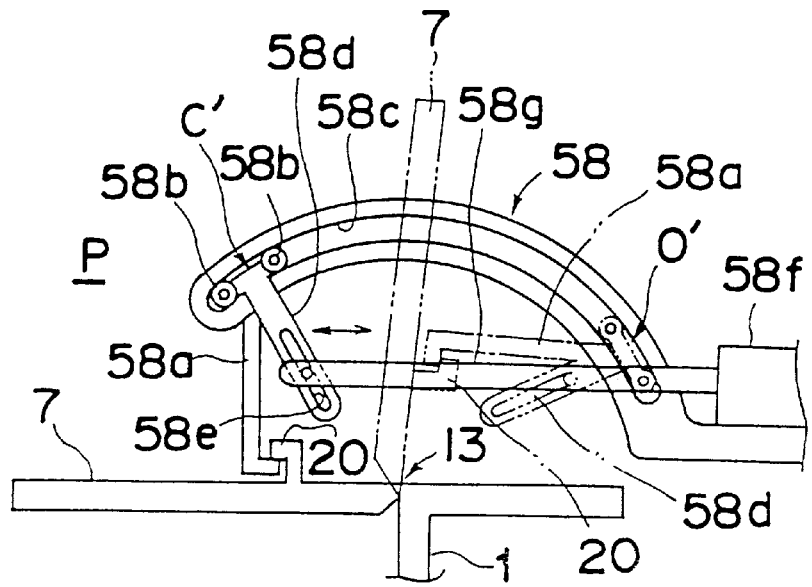
FIG. 13 is a diagram representing the opening/closing operation of lid means of the component collective of FIG. 11.
Figure 14:
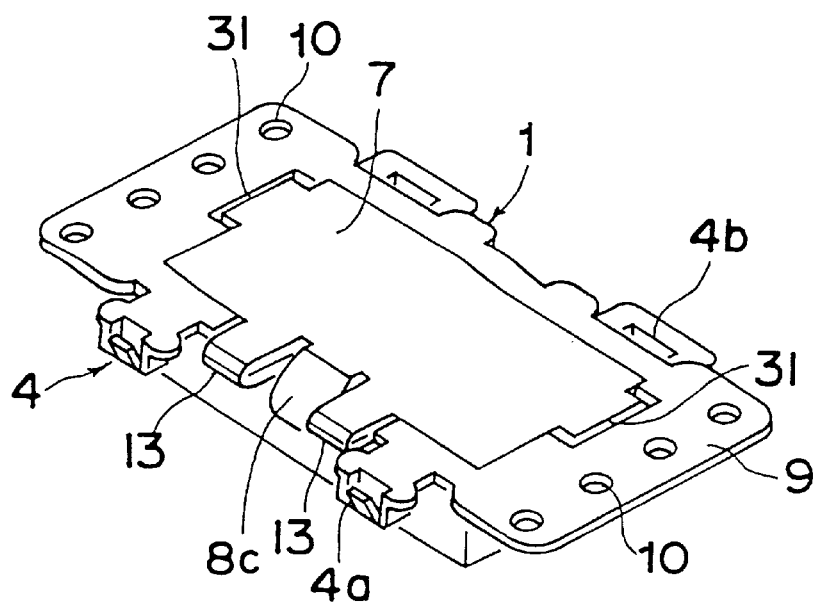
FIG. 14 is a perspective view indicating the closed state of a component collective in a fifth embodiment of the present invention.
Figure 15:
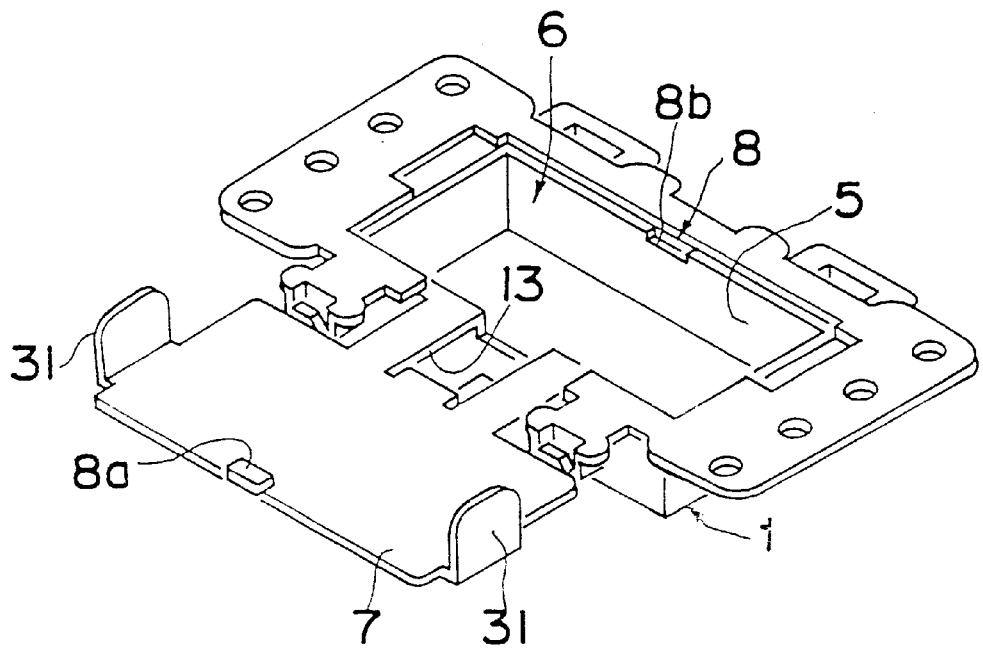
FIG. 15 is a perspective view of the opened state of the component collective in the fifth embodiment.
Figure 16:
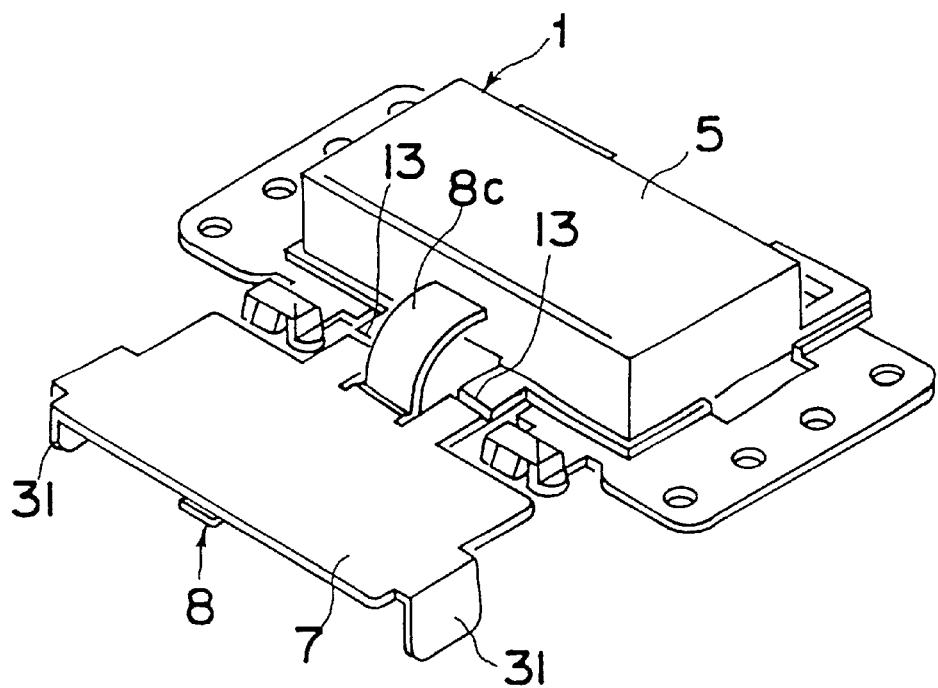
FIG. 16 is a perspective view of a state where a component holder in FIG. 15 is laid upside down.

Nevertheless, an opening/closing means 58 shown in FIG. 13 can be employed in the present fourth embodiment which serves both as the opening means and as the closing means for the component collective A. Since the opening/closing means 58 is positioned at the take-out position P, opening of the lids 7, taking-out of the component 3, and closing of the lids 7 are totally carried out when the component holder 1 is at the take-out position P. This is a second feature of the fourth embodiment.

In FIGS. 11–13, a hook 20 having an inverted L shape in cross section is integrally formed at the upper surface of each lid 7. The inner side of the hook 20 is opened. An L-shaped moving body 58*a* is disposed at the right and left of the opening/closing means 58 located above the component holder 1 at the take-out position P. The hook 20 is engaged with the L-shaped moving body 58*a*, thereby opening/closing the lid 7.

A pair of guide wheels 8*b* at the upper end of the L-shaped moving body 58*a* are guided along a circular arc guide groove 58*c*. The center of the guide groove 58*c* is determined at the hinge portion 13 of the lid 7. A projecting element 58*d*, integrally formed with the L-shaped moving body 58*a*, has a long hole 58*e* into which a front end of a rod 58*g* of an air cylinder 58*f* is fitted. Therefore, when the air cylinder 58*f* operates, the L-shaped moving body 58*a* is moved between a closing position C' and an opening position O' as indicated in FIG. 13.

While the lids 7 are opened and closed by the action of the air cylinder 58*f* of the opening/closing means 58, the component 3 in the component holder 1 at the take-out position P is taken out.

The fourth embodiment is the same in structure except the above first and second features as the first through third embodiments, and therefore the detailed description will be abbreviated.

A fifth embodiment of the present invention will be depicted with reference to FIGS. 14–16, and 18–19.

The fifth embodiment has a single lid 7, as opposed to the two lids in the previous embodiments. Hinge portions 13 of the lid 7 are formed in a direction orthogonal to the longitudinal direction of the component collective A. The resin spring 8*c* is similar to that of the fourth embodiment and a pair of right and left flaps 31 are integrally formed with the lid 7 to forcibly open the lid 7. Since the fifth embodiment is constructed in the same manner, except for the above points, as the other embodiments, further description thereof will be omitted.

Figure 18:
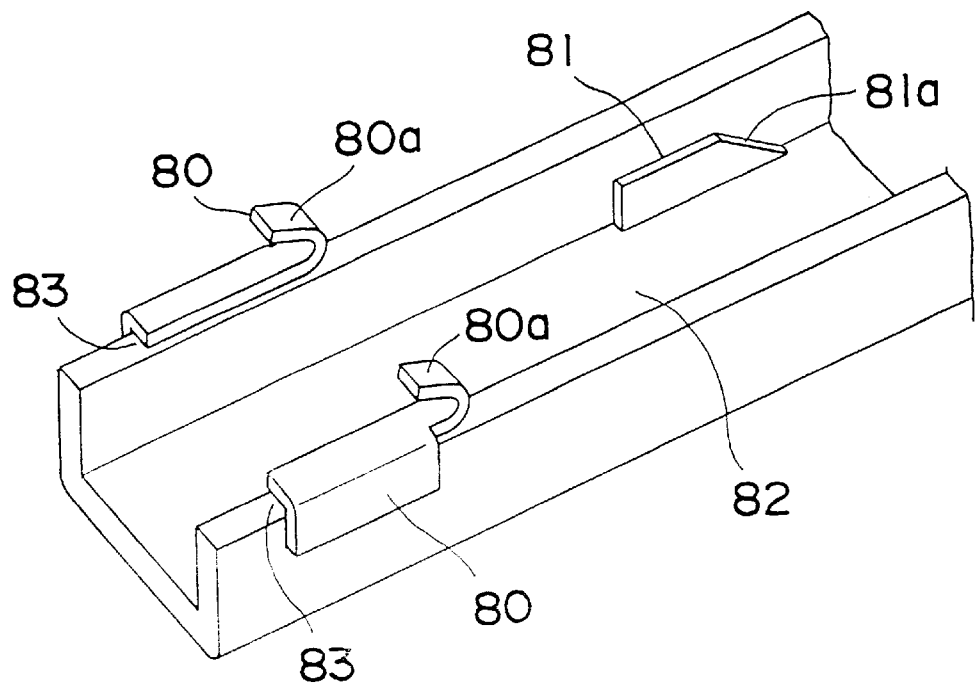
FIG. 18 is a perspective view of guides for opening and closing a lid in the fifth embodiment.
Figure 19:
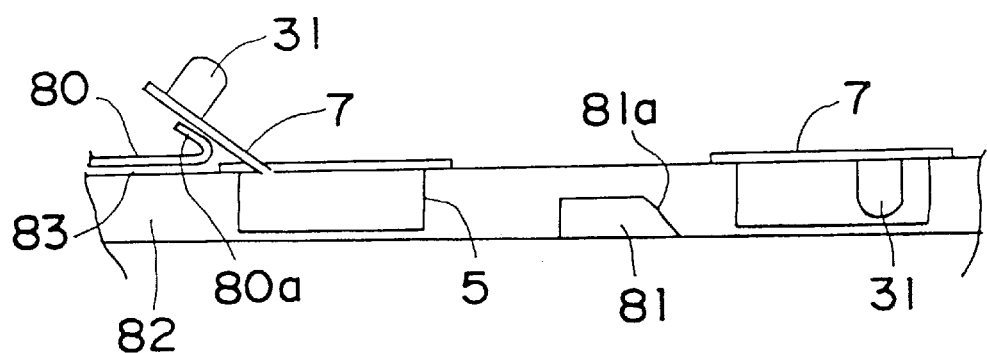
FIG. 19 is a side view of the guides in FIG. 18.

In the fifth embodiment, as shown in FIG. 18, in a case where the components collective A is transferred through a transfer path 82 having a C-shaped section, inclined guides 81 are properly arranged at the insides of both side walls of the path 82 and guide the flaps 31 up by inclined surfaces 81*a* of the inclined guides 81 with the component collective A transferred pitch by pitch in order to open the lid 7. Moreover, J-shaped guides 80 are arranged on upper surfaces of the side walls of the path 82 while a small gap 83 is formed between each lower surface of the guides 80 and each upper surface of the side walls of the path 82. The guides 80 have inclined surfaces 80*a* to guide the opened lid 7 in a direction to close the lid 7. That is, with the transfer of the component collective A along the path 82, the inclined surfaces 80*a* are brought into contact with the both sides of the opened lid 7 as shown in FIG. 19 and then the lid 7 is rotated and closed, so that the closed lid 7 is passed through the gap 83, and thereby it is ensured that the lid 7 is closed.

The present invention may be modified in various other ways. For example, the characteristic constitution of any one of the embodiments may be combined with the other embodiments to execute the invention.

As described hereinabove, the component collective A of the invention allows the reuse of the tape carrier after the components have been removed, resulting in superior cost-performance. Further, the component collective A prevents the component in the component holder from being damaged and protects against dust. The component collective A helps to make the feeding apparatus compact.

The feeding apparatus of the invention is fit for feeding the above-discussed advantageous component collective.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A feeding apparatus for feeding a component carrier which includes a plurality of component holders each holding a component therein and being connected to one another in the form of a tape carrier; each of the component holders being provided with a cavity to accommodate the component therein, a closure for shutting an opening of the cavity, and a closure securing means for securing the closure in a closed position, the feeding apparatus comprising:

a component carrier supply reel;

a means for transferring the component carrier;

a means for forcibly opening the closure of one of the component holders transferred to a predetermined position;

a means for forcibly closing the closure of the component holder after a component is removed from the component holder; and a wind reel for receiving the component carrier after the components have been removed and the closure has been returned to its closed position.

2. The feeding apparatus as claimed in claim 1, wherein the closure includes first and second lids which can be independently opened and closed, and the means for forcibly opening the closure includes first and second opening devices for opening the first and second lids, respectively.

3. The feeding apparatus as claimed in claim 1, wherein the closure includes first and second lids which are each pivotally connected to a peripheral edge of the cavity so as to be independently movable between an open position and a closed position, and the means for forcibly opening the closure includes first and second opening devices for pivoting the first and second lids, respectively, from a closed position to an open position.

4. The feeding apparatus as claimed in claim 1, wherein the closure includes first and second lids which can be independently opened and closed, and the means for forcibly opening the closure includes first and second pushing devices for engaging an interior surface of the first and second lids, respectively, and pushing the first and second lids into an open position.

5. The feeding apparatus as claimed in claim 1, wherein said means for forcibly opening the closure comprises:

a first air cylinder;

a first push rod which is slidably inserted in said first air cylinder;

a second air cylinder; and a second push rod which is slidably inserted in said second air cylinder, wherein said first and second push rods are operable to project through openings in the one component holder, located at the predetermined position, and into engagement with inner surfaces of first and second lids of the closure, respectively, in order to open the closure and permit removal of the component.

6. The feeding apparatus as claimed in claim 1, wherein said means for forcibly closing the closure comprises:

a first air cylinder;

a first push rod which is slidably inserted in said first air cylinder;

a second air cylinder; and a second push rod which is slidably inserted in said second air cylinder, wherein said first and second push rods are operable to engage outer surfaces of first and second lids of the closure of one of the component holders in order to forcibly close the closure after removal of the component.

* * * * *

UNITED STATES PATENT AND TRADEMARK OFFICE
CERTIFICATE OF CORRECTION

PATENT NO. : 5,931,282
DATED : August 3, 1999
INVENTOR(S) : Yoshio MARUYAMA et al.

It is certified that error appears in the above-identified patent and that said Letters Patent is hereby corrected as shown below:

On the title page in item [75] please insert fourth inventor --Shoriki Narita--.

Signed and Sealed this

Ninth Day of May, 2000

Attest:

Q. TODD DICKINSON

*Attesting Officer*  *Director of Patents and Trademarks*